United States Patent [19]

Little

[11] 4,380,112
[45] Apr. 19, 1983

[54] FRONT SURFACE METALLIZATION AND ENCAPSULATION OF SOLAR CELLS

[75] Inventor: Roger G. Little, Bedford, Mass.

[73] Assignee: Spire Corporation, Bedford, Mass.

[21] Appl. No.: 301,480

[22] Filed: Sep. 14, 1981

Related U.S. Application Data

[62] Division of Ser. No. 181,106, Aug. 25, 1980, abandoned.

[51] Int. Cl.$^3$ .............................................. H01L 31/18
[52] U.S. Cl. ........................................ 29/572; 29/399
[58] Field of Search .............. 29/572; 156/272; 65/36, 65/59 R; 136/251, 256, 259; 357/30 J, 65, 68, 73

[56] References Cited

U.S. PATENT DOCUMENTS

| 3,112,230 | 11/1963 | Rudenberg | 136/256 |
|---|---|---|---|
| 3,278,337 | 10/1966 | Gault | 136/255 |
| 3,442,007 | 5/1969 | Griffin | 228/179 |
| 4,260,429 | 4/1981 | Moyer | 136/256 |
| 4,267,003 | 5/1981 | Mesch et al. | 156/356 |
| 4,294,602 | 10/1981 | Horne | 65/40 |
| 4,296,270 | 10/1981 | Köhler | 136/244 |

OTHER PUBLICATIONS

G. A. Landis et al., "A Low-Cost Solar-Cell Front Contact Using Trapped Silver Mesh & Electrostatic Bonding", *IEEE Trans. Comp. Hybrids & Mfr. Tech.*, vol. CHMT-2, pp. 350-355, (1979).
J. A. Minnucci et al., "Integral Glass Sheet Encapsulation for Terrestrial Panel Applications", Conf. Record, 12th IEEE, Conf. (1976), pp. 309-312.
A. R. Kirkpatrick et al., "Status of Electrostatically Bonded Integral Covers...", Conf. Record, 12th IEEE Conf., (1976), pp. 573-576.
A. R. Kirkpatrick et al., "Production Technology for High Efficiency ion Implanted Solar Cells", Conf. Rec. 13th IEEE Conf., (1978), pp. 706-710.
P. R. Younger et al., "Terrestrial Solar Arrays with Intergral Glass Construction", Conf. Rec. 13th IEEE Conf., (1978), pp. 729-732.

*Primary Examiner*—Aaron Weisstuch
*Attorney, Agent, or Firm*—Morse, Altman & Dacey

[57] ABSTRACT

Method and apparatus for the front surface metallization and encapsulation of solar cells of the type comprising p and n semiconductor strata separated by a barrier junction, and front and rear conducting strata constituting electrical contacts, wherein the front conducting stratum is a novel metallic grid permitting transmission of solar radiation to the semiconductor strata. This metallic grid is in the form of a mesh of wires of sufficiently high tensile strength to be self-supporting while being drawn from spools or the like into contact with one or more components of the solar cell before completion of the cells's fabrication.

The method is characterized in that the metallic grid, in the form of the mesh of wires, is encapsulated between a transparent cover plate and the exposed front surface of the semiconductor strata, the mesh forming an electrical contact with the front surface of the semiconductor strata simultaneously that the plate is electrostatically bonded thereto.

The apparatus is preferably automated and conveyorized.

4 Claims, 13 Drawing Figures

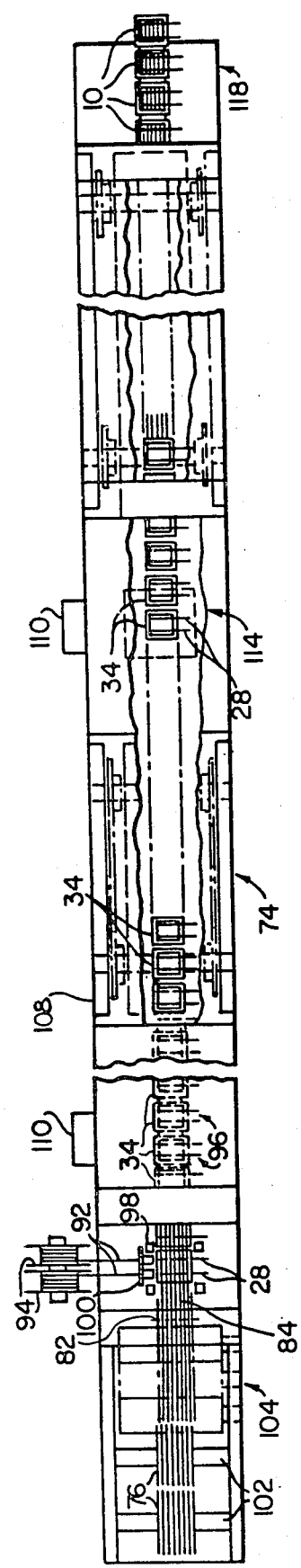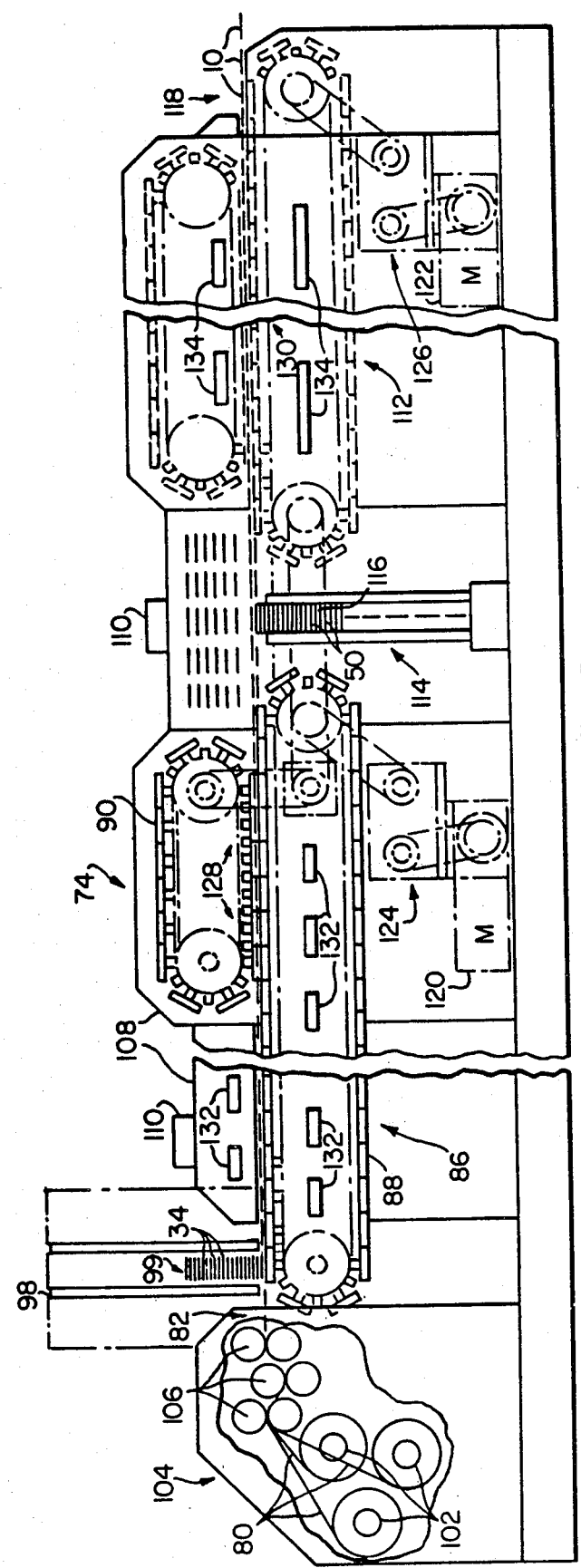
Fig. 12
Fig. 13

FRONT SURFACE METALLIZATION AND ENCAPSULATION OF SOLAR CELLS

This is a division of application Ser. No. 181,106 filed on Aug. 25, 1980 abandoned.

BACKGROUND OF THE INVENTION

1. Field of the Invention

The present invention relates generally to solar cells and, more particularly, to a method and apparatus for the front surface metallization and encapsulation of solar cells.

2. The Prior Art

In the fabrication of solar cells, one of the costliest steps involves applying a metallized contact grid to the cell front surface. Some high-efficiency solar cells have vacuum-deposited metal grids as front contacts. In this case, the metal is either evaporated onto the cell front surface through a shadow mask or else is selectively removed by photolithography from a continuous coating on the cell front surface. Often, the thickness of the deposited metal layer must be increased by electroplating or solder-dipping. These vacuum-deposition techniques are expensive because of inherent low speed and complexity and also because they are characterized by inefficient use of metal.

Of late, much effort has been directed at screen-printed ("thick-film") metal and directly plated metal for the front contact metallization of solar cells. Neither of these processes is yet a fully developed technology in the manufacture of solar cells, although some solar cells with screen-printed ("thick-film") contacts have become commercially available. Furthermore, with such screen printing, narrow conductor widths are difficult to produce and conductor cross section is relatively flat. As a result, resistivity of the bulk metal is high, with specific contact resistance being on the order of 100 m$\Omega$-cm$^2$. Furthermore, in making screen-printed ("thick-film") metal contacts on the front surfaces of solar cells, the p-n barrier junctions must be formed relatively deep to avoid cell degradation by the "spiking" of metal through the cell junction during the firing operation required to produce good adhesion and low conductive resistivity. The directly plated metal process, on the other hand, is still in the experimental stage. Both of these processes are rather sensitive to surface contamination, further increasing their costs. The problem of achieving low cost front contact metallization of solar cells, therefore, is and remains a fundamental limitation to the widespread terrestrial use of solar energy as a viable source of low cost electricity.

SUMMARY OF THE INVENTION

It is a principal object of the present invention to overcome the above disadvantages by providing a cost-effective method and apparatus for the front surface metallization and encapsulation of solar cells.

More specifically, it is an object of the present invention to provide a solar cell of the type comprising inner front and rear semiconductor strata for generating a photovoltaic effect in response to incident solar radiation and outer front and rear conducting strata constituting electrical contacts, wherein the semiconductor strata are of different p and n character and are separated by a p-n barrier junction, and wherein the rear conducting stratum usually is a metallic continuum and the front conducting stratum is a metallic grid that permits transmission of solar radiation to the semiconductor strata: in which the metallic grid is in the form of a mesh of wires of sufficiently high tensile strength to be self-supporting while being drawn from spools or the like into contact with one or more components of the solar cell before completion of its fabrication. The term "mesh of wires" as used herein defines a structure where the wires are running in one direction and does not necessarily imply that the wires cross each other. Preferably, before completion of the solar cell's fabrication, one or more conductive buses, in the form of metallic strips or ribbons of sufficiently high tensile strength to be self-supporting while being drawn from spools or the like, are connected electrically to the wire mesh and extended beyond the edge of the solar cell for electrical connection to the rear conducting stratum of an adjacent solar cell in order to facilitate the fabrication of a solar module. Preferably, completion of the solar cell's fabrication involves pressing the mesh and bus components into the softened inner surface of a transparent cover plate and electrostatically bonding the plate inner surface, together with the mesh and bus components, to the exposed face of the front semiconductor stratum. Preferably, the transparent cover plate is inorganic or organic glass. Alternatively, completion of the solar cell's fabrication involves interposing the mesh and the bus components between the cover plate and the exposed face of the front semiconductor stratum prior to electrostatic bonding. Alternatively, the electrostatic bonding involves the application of pressure to force the plate inner surface, together with the mesh and bus components, into contact with the semiconductor surface.

Other objects of the present invention will in part be obvious and will in part appear hereinafter.

The invention accordingly comprises the method, the apparatus and the product of the present disclosure, its components, parts and their interrelationship, the scope of which will be indicated in the appended claims.

BRIEF DESCRIPTION OF THE DRAWINGS

For a fuller understanding of the nature and objects of the present invention, reference is to be made to the following detailed description, which is to be taken in connection with the accompanying drawings, wherein:

FIG. 12 is a plan view of an apparatus constructed in accordance with and for practicing another preferred continuous method of the present invention; and FIG. 13 is a side elevation of the apparatus shown in FIG. 12.

DETAILED DESCRIPTION OF PREFERRED EMBODIMENTS

The Solar Cell of FIGS. 1, 2, 7 and 8

Figure 6:
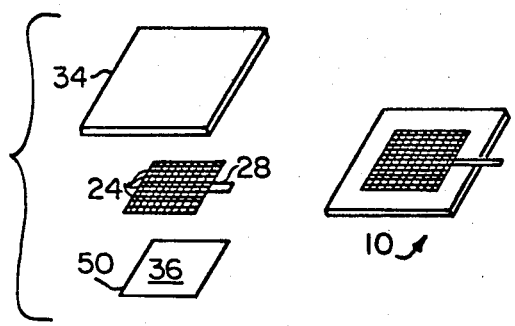
FIG. 6 is a schematic illustration of an alternate method of the present invention.

Generally, the present invention provides a cost-effective method and apparatus for the front surface metallization and encapsulation of a solar cell 10 of the type (see FIG. 2) comprising an inner front 12 and an inner rear 14, semiconductor stratum for generating a photovoltaic effect in response to incident solar radiation 16. The solar cell 10 further comprises an outer front 18 and an outer rear 20 conducting stratum constituting electrical contacts for the cell 10. The semiconductor strata 12 and 14 are of different p and n character and are separated by a p-n barrier junction 22. Usually, the outer rear conducting stratum 20 is a metallic continuum and the outer front conducting stratum 18 is a metallic grid that permits transmission of the solar radiation 16 to the inner semiconductor strata 12 and 14. According to the invention, the metallic grid 18 is in the form of a mesh of wires 24 of sufficiently high tensile strength to be self-supporting while being drawn from spools 26 or the like into contact with one or more of the components of the solar cell 10 before completion of its manufacture. Preferably, before completion of the fabrication of solar cell 10, one or more conductive buses 28, in the form of metallic strips or ribbons of sufficiently high tensile strength to be self-supporting while being drawn from spools 26 or the like, are connected electrically to the wire mesh 24 and extended beyond the edge of the solar cell 10 for electrical connection to the rear conducting stratum 20 of an adjacent solar cell 10 in order to facilitate the fabrication of a solar module 30, observe FIG. 4, to be described in detail below. Also preferably, completion of the fabrication of solar cell 10 involves pressing the wire mesh 24 and the conductive bus 28 components into the softened inner surface 32 of a transparent cover plate 34. Completion of the fabrication of solar cell 10 involves electrostatically bonding the inner surface 32, together with the mesh 24 and the bus 28 components, to the exposed face of the front semiconductor stratum 12. Alternatively, completion of the fabrication of solar cell 10 involves interposing the mesh 24 and the bus 28 components between the cover plate 34 and the exposed face 36, i.e., the front surface, of the front semiconductor stratum 12 prior to the electrostatic bonding, observe FIG. 6. In either case, electrostatic bonding is effected either with or without the application of compression pressure to force the transparent cover plate 34 into contact with the front semiconductor stratum 12. The apparatus is preferably automated and conveyorized as illustrated in FIGS. 12 and 13 for practicing a continuous method for the front surface metallization and encapsulation of solar cells 10.

The front surface metallization of a solar cell must satisfy several conflicting requirements, such as: (1.) the metal coverage of the front surface of the solar cell must be low in order to minimize losses due to the shadowing of the cell surface; (2.) the distance from any point on the cell front surface to the nearest metallization element must be short in order to minimize sheet resistance losses in the front surface layer; (3.) resistance along the wire mesh and the conductor bus must be low; and (4.) contact resistance between the metallization element and the semiconductor front surface must be low in order to minimize power losses due to these resistances.

Figure 7:
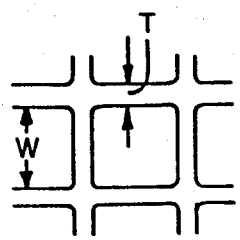
FIG. 7 is a schematic diagram of a wire mesh element unit cell.

These conflicting requirements are best satisfied by a front metallic grid pattern comprising many fine, thin wires rather than fewer wider wires. The power losses in a solar cell due to the several resistances and the shadowing can be derived from power criteria. With the aid of these criteria, the size and shape of the mesh can be optimized. A schematic diagram of an optimized wire mesh element unit cell is depicted in FIG. 7. The unit shown in square, although a rectangular mesh may be preferred in some applications. In the unit cell shown in FIG. 7, the letter "T" denotes the thickness in cm of the wire mesh, which thickness is assumed to be equal to its width. The letter "W", on the other hand, denotes the width of the open mesh element, also in cm. This width of the open mesh element is, of course, determined by the wire spacing per cm. The fraction of power lost (Pshadow) in a solar cell due to the shadowing of the solar cell area is best expressed by the fractional cell area that is covered: Pshadow=2T/W. The total fraction of solar cell power lost is the sum of the fractional power losses due to sheet resistance, wire mesh and conductor bus resistances, and contact resistance, in addition to the above-mentioned shadowing. Assuming zero contact resistance, Air Mass 1 (AM1) intensity and values for a silver (Ag) wire mesh on a 10 $cm^2$ unit cell, the global optimum mesh parameters are: W=0.185 cm and T=29.4 mm; and the resulting total power loss is about 5.59 percent. [Maximum light on the ground at sea level is called Air Mass 1; its intensity is about 1 $kWm^{-2}$. In high mountains, the intensity increases to 1.1 $kWm^{-2}$. Solar light outside the atmosphere is called Air Mass 0 (AM0); its intensity is about 1.38 $kWm^{-2}$. The maximum theoretical conversion efficiency of a conventional silicon solar cell under maximum illumination with solar radiation on the ground is about 23 percent.]

It requires a rather costly electroforming process, however, to form such an optimized wire mesh element unit cell as shown in FIG. 7. It has been found, however, that there is no need for having such a cross-hatched pattern for the front surface metallization of solar cells 10. Rather, the single-dimensional mesh of wires 24, with one or more conductive buses 28 in the form of metallic strips or ribbons, do result in solar cells 10 according to the invention that are low cost and are characterized by a conversion efficiency of better than ten percent (AM1).

Because of the p-n barrier junction 22, which is essential for the photovoltaic effect, solar cells 10 possess diode characteristics in the dark. Inside this p-n barrier junction 22, there exist an electric field and a potential difference which are entirely due to the difference in doping between the front and the rear semiconductor strata 12 and 14. In the dark, this internal electric field opposes the passage of an electric current. If an external voltage is applied in the reverse direction, the electric field is strengthened and with it the barrier to the electron flow so that the current is unable to increase with voltage. If an external voltage is applied in the forward direction, the internal voltage is progressively compensated by the external voltage which acts in the opposite direction. The forward current increases until the internal voltage is completely overcome. At this point, the current is no longer limited by the p-n barrier junction 22.

When the solar cell 10 is illuminated by solar radiation 16, electrons are liberated and are acted on by the internal electric field which drives the electrons in its direction. Consequently, a photocurrent is generated which flows in the opposite direction with respect to the forward "dark current." With no external voltage applied, this photocurrent continues to flow and is measured as the short-circuit current ($I_{sc}$). This $I_{sc}$ current depends linearly on light intensity since, when more light is absorbed, additional electrons are exposed to the internal electric field force inside the p-n junction barrier 22. This $I_{sc}$ current is not influenced by any applied voltage. An open-circuit voltage ($V_{OC}$) condition is achieved when the photocurrent is balanced by a forward "dark current" associated with the photovoltage, which generates a forward current exactly like an externally applied voltage.

Figure 8:
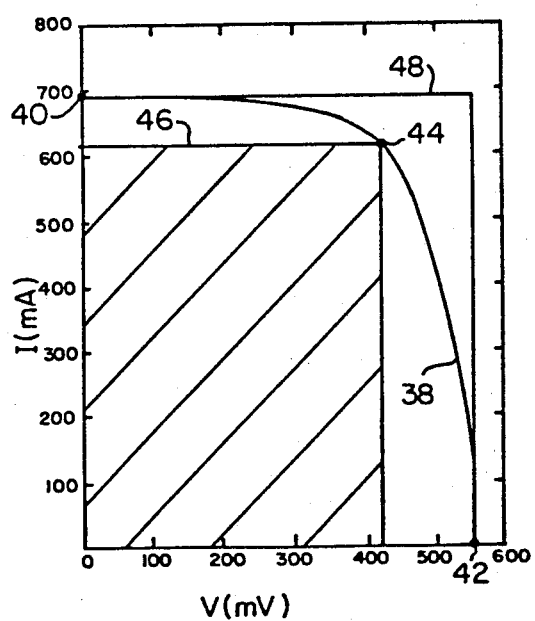
FIG. 8 is an illustration of the current-voltage (I-V) characteristic of a typical solar cell constructed in accordance with the present invention.

The current-voltage (I-V) characteristic of a typical solar cell 10 constructed in accordance with the present invention and under AMO solar illumination is illustrated in FIG. 8. An I-V curve 38 is plotted along positive voltage and current axes, with an $I_{sc}$ value 40 of slightly less than 700 mA, a $V_{oc}$ value 42 of little more than 550 mV, and a maximum power point 44. The maximum power obtainable from the solar cell 10 is achieved by optimizing the product of the current and the voltage ($I_m \times V_m$). This maximum power point 44 corresponds to a voltage ($V_m$) which is somewhat lower than $V_{oc}$ 42. The solar cell 10 can be fixed to operate at its maximum power point 44 either by applying an external voltage $V_m$ or by connecting the cell 10 to a load resistance $R = V_m/I_m$. There are two rectangles located at the I-V curve 38, a smaller, shaded rectangle 46 and a larger, unshaded rectangle 48. The ratio of the smaller rectangle 46 to the larger rectangle is denoted as the "curve fill factor." The closer the curve fill factor gets to its theoretical maximum of 1.0, the more efficient is the particular solar cell. Solar cells 10 produced according to the present invention have been characterized by curve fill factors of about 0.69 or better.

Figure 1:
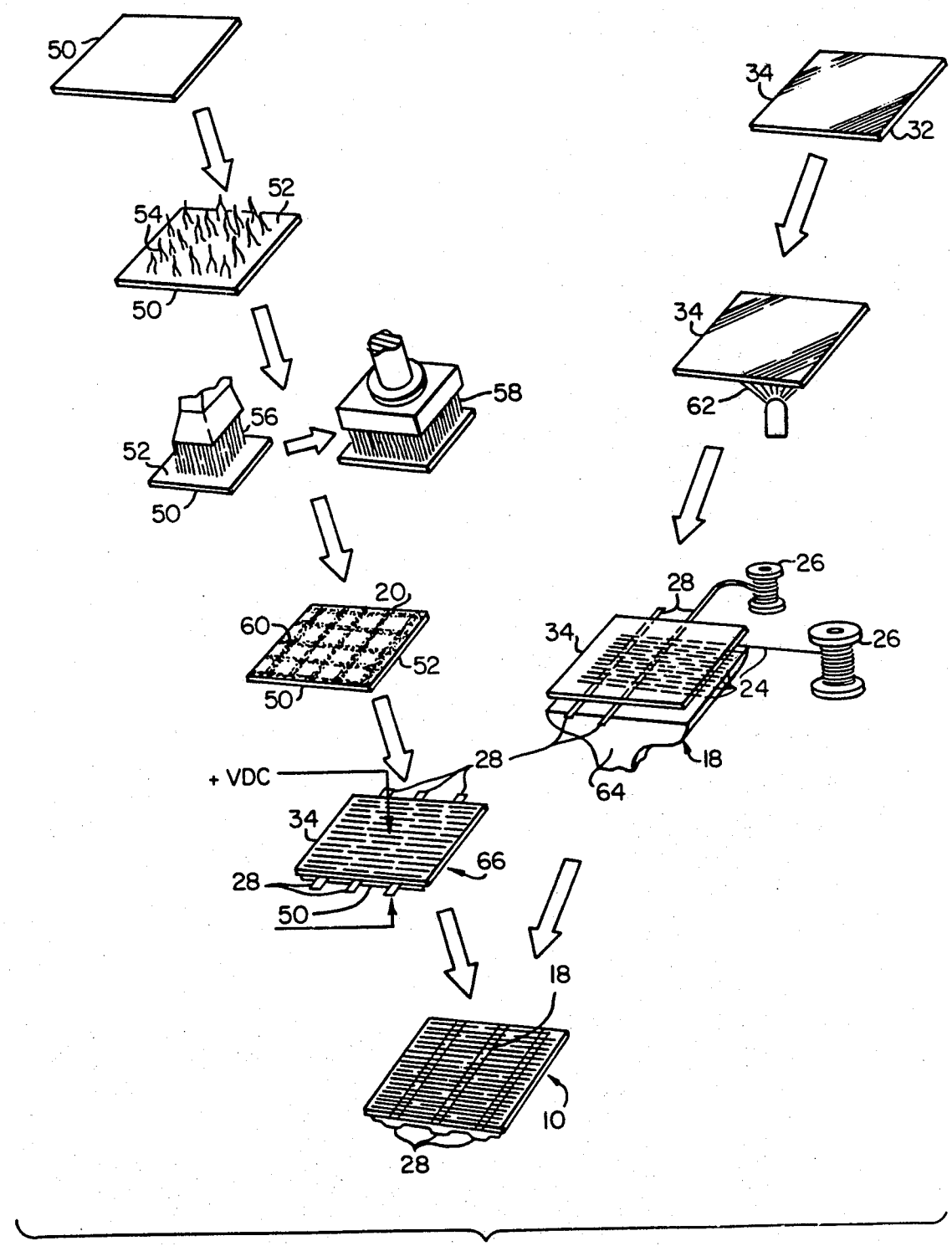
FIG. 1 is a schematic illustration of a method of the present invention.
Figure 9:
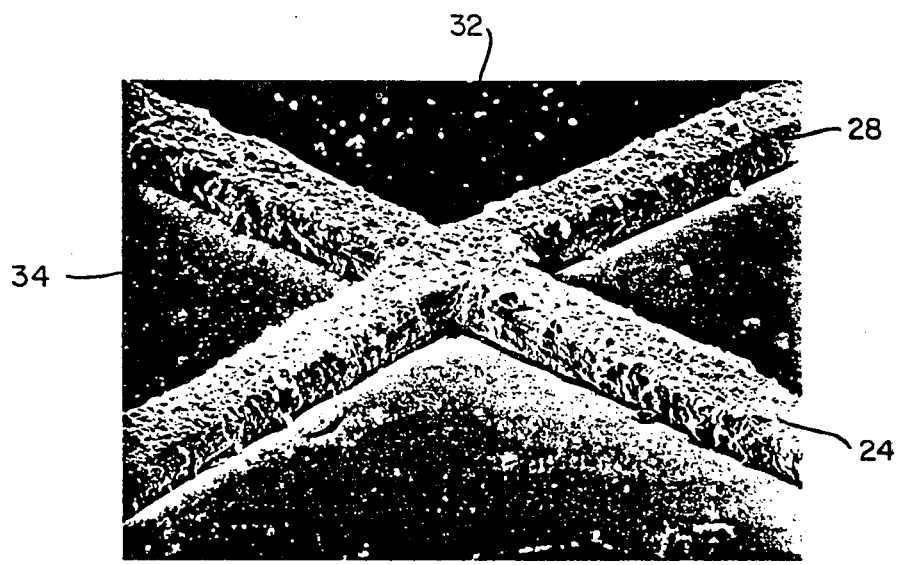
FIG. 9 is an illustration, on an enlarged scale, of a wire crossed by a conductive bus and pressed into the softened inner surface of a solar cell glass cover plate.
Figure 10:
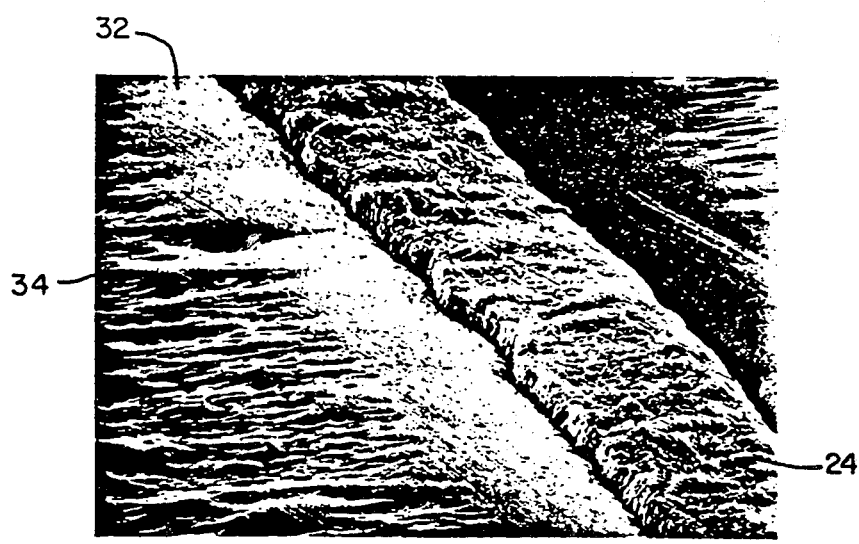
FIG. 10 is also an illustration, on a more enlarged scale, of one wire of a mesh of wires pressed into the softened inner surface of a solar cell glass cover plate.

The Fabrication Method of FIGS. 1, 9 and 10

Many, if not most, solar cells today are manufactured from single-crystal material. Most of these solar cells are round because they are made from wafers which are cut from monocrystalline rods, which rods have been pulled from a melt. With particular reference to FIG. 1, the preferred starting material for the process of the present invention is a low-cost p-type semiconductor material, such as single-crystal silicon, preferably grown by the heat exchanger method (HEM) and slab cut to a square cross section. The slabs are then sliced, using a fixed abrasive sawing technique (FAST) to produce thin, square wafers 50. The process of the invention is, however, not limited to HEM grown materials; it being understood that other low-cost semiconductor materials can be used as a starting material provided that the saw damage occurring during slicing is limited to a depth of less than ten microns so that the damage is compatible with plasma etching.

Only one side 52 of the thin, square wafer 50 is plasma etched as at 54 for removal of saw damage since the other side will be alloyed to a depth exceeding the maximum saw damage depth. Plasma etching 54 is preferably done in a barrel-type reactor, not shown, such as the LFE Model 1002 Barrel Reactor, in which the wafers 50 are disposed back-to-back, thus cutting the surface area exposed to the plasma, typically sulfur hexafluoride gas ($SF_6$), by a factor of two. Etch rates achieved are typically 1.0 micron or more per minute.

The plasma etched wafer 50 is now ready for the formation therein of the p-n barrier junction 22 by ion implantation, as at 56. Since the starting material is a p-type semiconductor material, only a single ion species of dopant material, namely an n-type species, need be implanted. The ion implantation process 56 is characterized by generation of only small amounts of gaseous waste. This gaseous waste product is removed by conventional gas scrubbing techniques. Thus, ion implantation 56 is consistent with the dry processing (i.e., no wet chemistry steps) employed in the junction formation step of the process of the invention. If the starting material is an n-type semiconductor, then, of course, a p-type species of dopant material will have to be used in the ion implantation process 56. Should the starting material be a semiconductor that is neither p-doped nor n-doped during its growth, then it will be necessary to introduce both p and n dopant materials during the ion implantation step 56.

Following ion implantation 56 for junction dopant introduction, any inherent lattice damage caused by ion implantation in the semiconductor wafer 50 must be annealed, as at 58. Preferably, the annealing step 58 is a pulsed electron beam annealing in which only the junction side 52 of the wafer 50 is heated, precluding thereby both grain boundary diffusion and surface oxide growth in the semiconductor wafer 50. Thus, there is no need for a further etching step following annealing. Furthermore, the pulsed electron beam annealing 58 is compatible with the ion implantation step 56, and both steps 56 and 58 are preferably carried in a common vacuum environment employing a common wafer transport system.

After the junction formation by ion implantation 56 and annealing 58, the junction side 52 of the semiconductor wafer 50 is turned face down so as to present the back side 60 of the wafer for the formation thereon of the outer rear conducting stratum 20. Usually, this rear conducting stratum 20 is a metallic continuum. The rear conducting stratum 20 can also comprise a screen printed metallic paste, suitably dried to drive off any volatile solvents in the paste, and alloyed at an elevated temperature and in a nitrogen atmosphere. Such a screen printed, gridded electrical contact for the rear conducting stratum 20 is useful to provide an ultrasonically bondable surface to the semiconductor wafer 50 for subsequent cell interconnection to produce a solar module. After back contact alloying, the wafer 50 is convection cooled and again turned so as to present once again its bare junction side 52 for front surface metallization and simultaneous encapsulation.

Concurrently with the preparation of the semiconductor wafer 50 as just described, the transparent cover plate 34 is also subjected to certain processing. The transparent cover plate 34 preferably is square and formed of glass, such as Corning type 7070 glass, which in thermal expansion, closely matches silicon, the preferred semiconductor material for the wafer 50. The transparent cover plate 34 can also be formed of an organic glass possessing a thermal expansion coefficient that is close to that of silicon. Organic glass is herein defined to denote an amorphous, solid, glasslike material composed of transparent plastic.

The transparent cover plate 34 is preferably provided at its inner or underside surface 32 with an anti-reflective (AR) coating. The AR coating provides a graded index for the nontexturized junction side 52 of the semiconductor wafer 50 to reduce reflective losses at the dielectric interface between the silicon and the glass. The AR coating consequently increases both the short-circuit current ($I_{sc}$) 40 and the maximum power point 44 of the resultant solar cell 10. The inner surface 32 of the cover plate 34 must first be cleaned, such as by ultrasonic vapor degreasing, in order to assure the proper adhesion thereto of the AR coating. The AR coating must also be compatible with subsequent processing, including electrostatic bonding. The preferred material for the AR coating comprises a silica-tantalum pentoxide ($SiO_2/Ta_2O_5$) mixture. If a higher refractive index value is desired, zirconium oxide ($ZrO_2$) can be added to the silica-tantalum pentoxide mixture. In either event, the mixture is preferably spray coated, as at 62, onto the inner surface 32 of the cover plate 34. Spray coating is preferred because it permits precise deposited film-thickness control and is also an economical method. Intimate contact between the AR coating and the nontexturized junction side 52 of the wafer 50 is assured following electrostatic bonding and the characteristics of the AR coating are identical to coatings applied directly to the semiconductor surface.

In the alternative, reduction of reflective losses at the dielectric interface between the front semiconductor stratum 12 and the glass cover plate 34 involves texturizing the junction side 52 of the semiconductor wafer 50 or applying a conductive AR coating, such as indium-tin oxide, to the junction side 52 prior to electrostatic bonding.

Sintering cycles, to increase the refractive index and the adhesive quality of the AR coating to the inner surface 32 of the cover plate 34, are effected during the immediately next following process step involving the transparent cover plate 34. This step is the metallization of the inner surface 32 of the cover plate 34. The metallization involves the formation of the metallic grid 18 and the pressing of this grid 18 into the softened inner surface 32 of the plate 34. The metallic grid 18 is preferably in the form of the single-dimensional mesh of wires 24, and one or more conductive buses 28, in the form of metallic strips or ribbons, stretched over a suitable pressing device, such as a mandrel 64. It will be noted that the buses 28 extend beyond the edge of the cover plate 34 to facilitate the making of a solar module as more fully described below.

The wires 24 and the conductive buses 28 are very fine, direction-drawn lengths from spools 26 or the like, with a diameter range of from about ten to about fifty microns. The wires 24 are parallel-aligned according to a grid design having a wire spacing of from about eight to about ten wires per centimeter. Both the wires 24 and the conductive buses 28 preferably comprise titanium-coated silver. Alternatively, the wires 24 and the buses 28 comprise nickel-plated copper (Cu/Ni plated), molybdenum (Mo), copper (Cu), nickel (Ni), tungsten (W), or silver-plated nickel (Ni/Ag plated) or copper (Cu/Ag plated), or other like metals with or without silver plating about the wires 24 and the buses 28 provided they possess the required sufficiently high tensile strength to be self-supporting while being drawn from the spools 26 or the like.

Before the formed metallic grid 18 is pressed into the inner surface 32 of the transparent cover plate 34, the inner surface 32 is softened by exposing it to a temperature of about 700° C. Simultaneously, the mandrel 64 and the metallic grid 18 stretched over it are also brought to this temperature of about 700° C. Then, the mandrel 64, together with the mesh of wires 24 and the buses 28, are forced against the softened inner surface 32 of the cover plate 34 with a preferred compression pressure of about 200 psi for about one minute. The combination of heat and pressure causes the deformable cover plate 34 to deform about the mesh of wires 24 and the conductive buses 28, resulting in a coplanar metal-glass surface, as can be best observed in FIGS. 9 and 10. The combination of heat and pressure also causes the wires 24 and the buses 28 to acquire a rectangular cross section, with a width of about three times that of its thickness. As mentioned, this heat treatment also serves to sinter the sprayed-on AR coating previously formed on the inner surface 32 of the cover plate 34. Sintering of the AR coating increases its refractive index and also serves to improve its adhesion to the surface 32.

The final step in the process of the front surface metallization and encapsulation of solar cells 10 involves the electrostatic bonding, as at 66, of the cover plate inner surface 32, with the mesh 24 and bus 28 components imbedded therein, to the bare, exposed junction side surface 52 of the previously processed semiconductor wafer 50. Electrostatic bonding 66 can be effected, according to the invention, either with or without compression pressure urging the cover plate inner surface 32 against the exposed wafer surface 52 and into contact therewith.

Electrostatic bonding is an electric field-assisted method for sealing glass to metals, semiconductors or dielectrics. In general, electrostatic bonding involves heating the glass to a temperature at which ionic conduction within the glass can take place. This is followed by applying a strong electric field across the glass and the material to be sealed. Under the influence of the electric field, mobile positive ions within the glass are caused to move away from the glass-semiconductor interface. A polarization layer, supportive of the electric field, is thus established at the glass-semiconductor interface as this charge redistribution occurs. Where the glass and semiconductor surfaces are not in contact, the applied voltage appears across the gap separating these surfaces. The resulting electrostatic forces pull the closely spaced glass and semiconductor surfaces together, permitting thereby the establishment of the polarization layer along the entire glass-semiconductor interface. Once the polarization layer at this interface is fully established, a chemical bond is formed between the oxygen ions in the depleted region of the glass and the positive ions in the semiconductor material. This chemical bond is permanent.

The magnitude of the electrostatic forces (F), pulling the closely spaced glass 32 and semiconductor surfaces 52 together, per unit area between a point on the surface of the glass interface and a corresponding point on the surface of the semiconductor interface 52 is defined by the formula $$F = \tfrac{1}{2} \epsilon (V/d)^2,$$

where e is the dielectric constant, V is the potential difference between the two points, and d is the width of the gap between the two points. See U.S. Pat. No. 3,417,459 to Pomerantz et al. The magnitude of these pulling electrostatic forces (F) is thus critically influenced by the width of the gap (d) separating the opposing glass-semiconductor surfaces 32 and 52 and the potential difference (V) between these surfaces. The width of the gap (d) is controlled during the metallization step of the cover plate 34, above described. By the application of a relatively high temperature (about 700° C.) to the inner surface 32 of the cover plate 34 and a pressure of about 200 psi, the wire mesh 24 and the conductive buses 28 are embedded in the surface 32 so as to result in a rather flat, smooth coplanar metal-glass surface, as may be best observed in FIGS. 9 and 10. Likewise, the junction side surface 52 of the semiconductor wafer 50 is also a flat and smooth surface due to its above-described processing, involving plasma etching 52 and annealing 58. The width of the gap (d) between the glass and the semiconductor surfaces 32 and 52 is accordingly negligible. Consequently, the application of a voltage between about 500 to about 1,000 VDC, in the presence of a bonding temperature of about 400° C., for a time interval of about three to five minutes, combine to result in a good, permanent chemical bond between the glass inner surface 32, with the metallic grid 18 imbedded therein, and the exposed junction side surface 52 of the semiconductor wafer 50. Furthermore, as a result of this electrostatic bond between the surfaces 32 and 52, an optically coupled integral bond is also formed between the cover plate 34 and the front semiconductor stratum 12. The electrostatic bonding 66 also effects a permanent hermetic seal about this front semiconductor stratum 12, that is, it encapsulates this stratum 12 at the same time that the stratum 12 becomes metallized with the front metallic grid 18. The hermetic seal achieved during encapsulation effectively prevents oxidation of the mesh of wires 24 and the buses 28. The good ohmic electrical contact formed by the mesh of wires 24 and the buses 28 with the front semiconductor stratum 12 is thus effectively preserved for the entire expected useful life of the resultant solar cell 10. (The expected useful life of the solar cell 10 produced according to the invention is estimated to exceed twenty years.) The ohmic electrical contact between the wires 24 and the buses 28 and the stratum 12 formed during the electrostatic bonding 66 step is in the nature of a thermocompression bond and not a chemical bond as between the glass inner surface 32 and the semiconductor surface 52.

Figure 4:
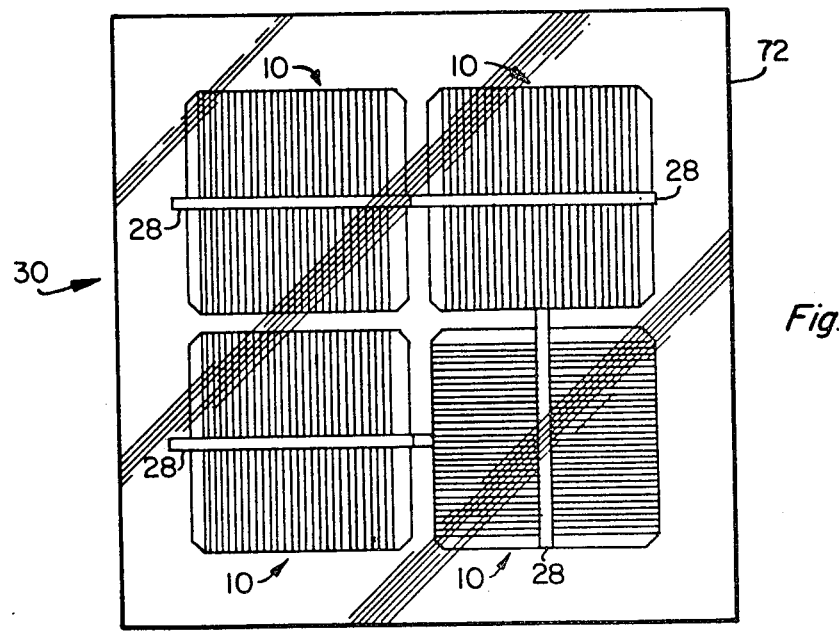
FIG. 4 is a plan view of a four-cell solar minimodule constructed in accordance with the present invention.
Figure 2:
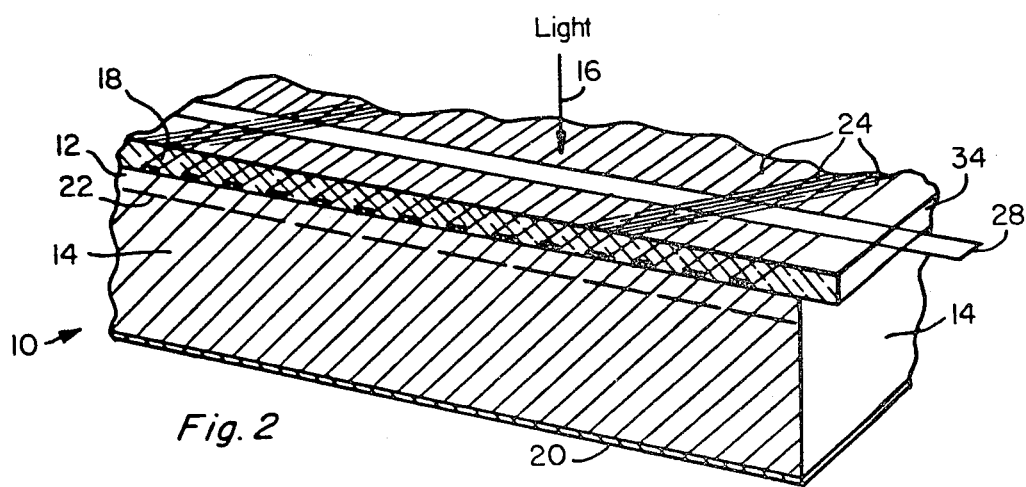
FIG. 2 is a schematic cross section, on an enlarged scale, of a fraction of a solar cell constructed in accordance with the present invention.
Figure 5:
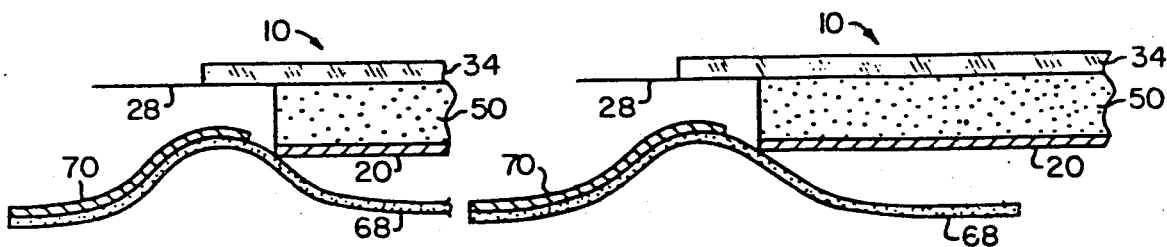
FIG. 5 is a schematic illustration of the electrical interconnection between two adjacent solar cells designed to be formed into a solar module.

The Solar Module of FIGS. 4 and 5

The solar cell 10 thus fabricated according to the process described with reference to FIG. 1 is now ready, following testing, for electrical interconnection to other solar cells 10 to form a solar module, such as the minimodule 30 illustrated in FIG. 4. The solar module represents the smallest electrical unit of assembled cells. Several modules comprise a solar panel. The solar panel represents the smallest mechanical unit of assembled solar cells. A solar generator or solar array is built by assembling a plurality of solar panels. Normally a solar module, unlike the illustrated minimodule 30, contains about seventy solar cells 10.

Figure 3:
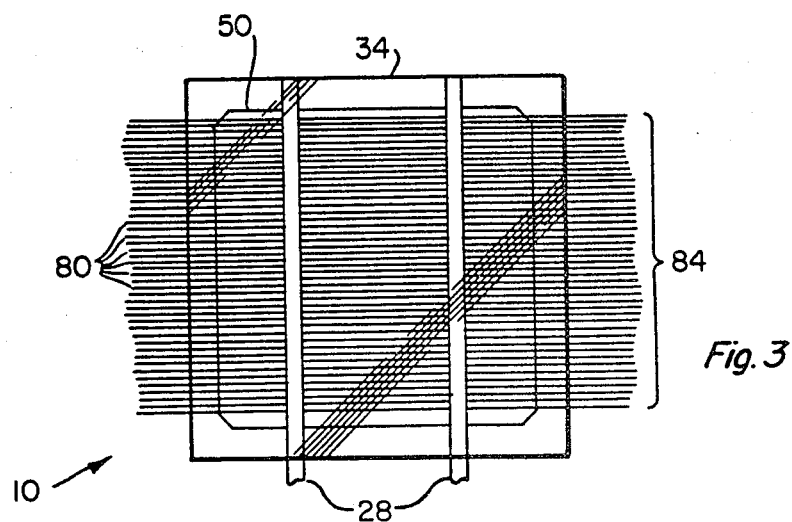
FIG. 3 is a plan view of another solar cell constructed in accordance with the present invention.

The preferred electrical interconnection between two adjacent solar cells 10 is illustrated in FIG. 5. This interconnection preferably comprises a glass backing scrim 68 having an interconnect conductor 70 printed thereon. The interconnect conductor 70, with its backing scrim 68, preferably is ultrasonically welded to the conductive bus 28 of one solar cell 10 and to the rear conducting stratum 20 of the adjacent cell 10. This kind of electrical connection is called a series connection and results in doubling the voltage between the two cells 10. In order to double the power at constant voltage, it becomes necessary to connect electrically the conductive bus 28 of one solar cell 10 to the conductive bus 28 of the adjacent cell 10, and the rear conducting stratum 20 of one cell 10 to the rear conducting stratum 20 of the adjacent cell 10, which is called a parallel connection. It is thus evident that by connecting a number of solar cells 10 in parallel and in series, it is possible to provide a solar module characterized by having any desired power at any desired voltage. The illustrated minimodule 30 comprises four solar cells 10 connected in series and integrally encapsulated by a front glass cover plate 72. The cells 10 in the minimodule 30 have but one conductive bus 28, whereas the solar cell 10 formed according to the process described with reference to FIG. 1 has three conductive buses 28. The preferred solar cell 10 shown in FIG. 3 is formed with two conductive buses 28 according to a preferred continuous method yet to be described with reference to FIGS. 11–13. Of course, each of such conductive buses 28 must be provided with electrical interconnectors to effect either a series or a parallel connection between adjacent solar cells 10.

Figure 11:
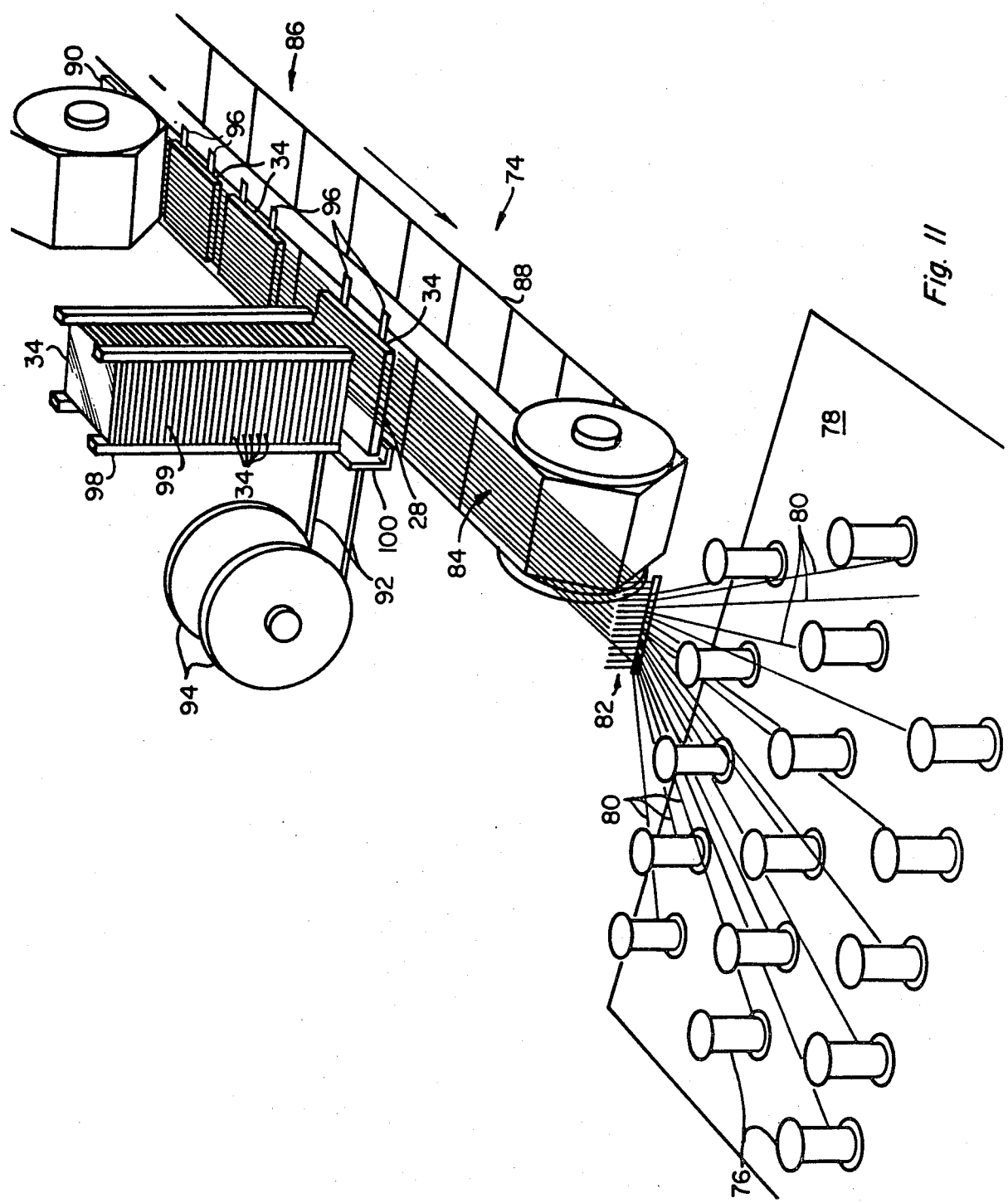
FIG. 11 is a perspective view of a portion of an apparatus constructed in accordance with and for practicing a preferred continuous method of the present invention.

The Apparatus and Process of FIGS. 11, 12 and 13

FIGS. 11–13 depict apparatus useful in the front surface metallization and encapsulation of solar cells 10 of the type shown in FIG. 3 by a continuous method. Specifically, in FIG. 11, there is shown in perspective a portion of an apparatus 74 comprising a plurality of spools or reels 76 mounted to a suitable creel frame 78. A plurality of thin wires 80 is shown unwinding from the spools 76 and being fed into a reed comb 82. The reed comb 82 provides the wire spacing and the tension control of the wire warp 84 being formed from the plurality of wires 80. The portion of the apparatus 74 so far described is much like the back end of a conventional weaving loom. The wire warp 84 is fed to a conveyorized furnace press 86 including bottom and top conveyors 88 and 90. A pair of conductive buses 28, in the form of fine metallic strips or ribbons 92, are shown unwinding from spools 94 at right angles to the wire warp 84 and are laid thereacross so as to extend beyond the wire warp 84, as at 96. A transparent cover plate 34, processed as hereinabove described with reference to FIG. 1 and with its inner surface 32 facing toward the wire warp 84, is dispensed from a suitable dispenser 98 mounted above the bottom conveyor 88 and in line with the spools 94. Dispenser 98 is designed to accommodate a plurality of cover plates 34 arranged therein in a stack 99. With the cover plate 34 in place over the wire warp 84 and the pair of conductive buses 28, the strips or ribbons 92 are severed at the feed side by a vertically displaceable shear cutoff 100 flush with the edge of the cover plate 34. Further construction and operation of the apparatus 74 is best described with particular reference to FIGS. 12 and 13. Only the wire feed of the plurality of wires 80 is slightly different from what has so far been described with reference to FIG. 11 in the apparatus 74 shown in plan view and in side elevation in FIGS. 12 and 13, respectively. Here, the spools or reels 76 are mounted horizontally about a number of shafts 102. The plurality of wires 80 unwinding from these spools 76 are first fed to a straighten-and-tension device 104 comprising a serpentine train of rolls 106 before being fed to the reed comb 82. Tension control is thus effectively provided by the device 104, with the reed comb 82 providing primarily the wire spacing for the wire warp 84.

Apparatus 74 is, furthermore, preferably enclosed within a housing 108 that is continuously flushed with an inert gas, such as argon (A). Argon gas under slight pressure above atmospheric is admitted continuously into the interior of the housing 108 from valved containers 110. Apparatus 74 is automated and designed to process about 3,500 solar cells 10 per hour. The three main tasks of the apparatus 74 include: (a) establishment of the wire warp 84, together with the periodic, spaced deposition thereon of the pairs of conductive buses 28 and the cover plates 34; (b) heating the inner surfaces 32 of the cover plates and pressing the wire warp 84 and the buses 28 into the softened inner surfaces 32 of the plates 34; and (c) electrostatically bonding the inner surfaces 32 of the plates 34, with the warp 84 and the bus 28 elements embedded therein, to the bare, nontexturized junction side (i.e., front) surfaces 52 of the semiconductor wafers 50 that have already been plasma etched, ion implanted and annealed, as above described with reference to FIG. 1.

As will be noted from a viewing of FIGS. 12 and 13, apparatus 74 comprises two conveyorized furnace presses: the one 86 already described and designed to accomplish the first two main tasks (a) and (b) just described; and a second conveyorized furnace press 112 designed to accomplish the third main task of electrostatically bonding the plates 34, together with the warp 84 and bus 28 elements, to the front surfaces 52 of the semiconductor wafers 50. The two conveyorized furnace presses 86 and 112 are joined about midway therebetween by a wafer dispensing station 114 mounted in a cooldown zone of the apparatus 74. Station 114 is designed to dispense the wafers 50 stacked therein as at 116, so as to mate the wafers 50 with the respective cover plates 34 as the plates are indexed past the station 114 by the conveyorized presses 86 and 112.

Initially, the start-up of the operation of the apparatus 74 involves the clamping of the free end of the wire warp 84 first to a station on the first conveyorized furnace press 86 and then to a station on the second conveyorized furnace press 112. It is the wire warp 84 that provides the continuity to the process, with the metallized and encapsulated solar cells 10 emerging from the 2nd furnace press 112 held together by the wire warp 84 as beads on a string. The finished solar cells 10 are laterally severed from each other at a trimming station 118 and, following testing, are ready to be ultrasonically (or otherwise) united into solar modules, preferably employing the interconnecting technique described with reference to FIG. 5.

Each of the conveyorized furnace presses 86 and 112 is preferably driven by its own motor (M) 120 and 122, respectively. Motors 120 and 122 are synchronized to advance the wire warp at the same predetermined distance and at the same rate and with the same dwell time between indexing. It is during these dwell times between indexing that the presses 86 and 112 accomplish their tasks of uniting the wire warp 84 and buses 28 with a cover plate 34 in the first case, and of electrostatically bonding with pressure a cover plate 34, with the warp 84 and buses 28, to the front surface 52 of a semiconductor wafer 50.

The motors 120 and 122 drive their respective conveyors via suitable drives 124 and 126. Each press 86 and 112 is provided with its own respective press stations 128 and 130. Furthermore, each press 86 and 112 has its own bank of heaters 132 and 134, respectively. The press stations 130 in the second conveyorized furnace press 112 are electrostatically charged to provide the conditions required for the electrostatic bonding of the wafer front surfaces 52 to the inner surfaces 32 of the glass cover plates 34, all as previously described.

EXAMPLE

Semiconductor wafers 50 were provided from p-type single-crystal silicon material grown by the HEM method, slab cut to a dimension of $11 \times 11$ cm and sliced by a FAST technique to produce wafers 50 of nine mils thick. The wafers 50 were cleaned, using an ultrasonic vapor degreaser, and their junction side surfaces 52 were plasma etched in an LFE Model 1002 barrel reactor for three minutes in an $SF_6$ plasma. Using a Spire Corporation Model JP-2 machine, the etched wafers 50 were ion implanted with a phosphorus (P) dopant and implant parameters of $1.5 \times 10^{15}$ $^{31}P+/cm^2$ at 10 KeV, resulting in a junction sheet resistance of 75 ohms per each square wafer 50 of 11 $cm^2$ and a p-n barrier junction 22 depth of 0.28 micron following annealing. Implantation throughput was 1800 wafers 50 per hour. The front surfaces 52 of the wafers 50 were annealed with pulsed electron beam annealing in a common vacuum environment with the ion implanation and at the same rate, using a common wafer transport. The electron beam had an average electron energy of about 10 KeV and beam energy density of 0.1 cal/$cm^2$. Then, the back sides 60 of the wafers 50 were screen printed with thick-film aluminum (Al) paste, achieving a 15% coverage, using a grid pattern. The Al paste was reflowed during an ensuing drying cycle at a temperature of 250° C., using an infrared belt dryer, to drive off any volatile solvents in the paste. The back surface gridded contact was then alloyed at 850° C. on an integral belt furnace in a recycled nitrogen ($N_2$) atmosphere, and the wafers 50 convection cooled.

Glass cover plates 34, in sizes $11.25 \times 11.25$ cm and twenty mil thick, were formed from Corning Type 7070 borosilicate glass and cleaned, also using an ultrasonic vapor degreaser. The inner sides 32 of the plates 34 were then spraycoated with a mixture of $Si\, O_2/Ta_5\, O_5$ to provide an AR coating, having a refractive index of 2.2. A wire warp 84 was strung with seventy-five wires 80, the wires 80 being nickel-plated copper, 0.0016 inch in diameter, with a wire spacing of 0.060 inch. The conveyorized furnace presses 86 and 112 were indexed at a distance of four inches and at a rate of 3,500 indexes per hour. The plates 34 were pre-heated at a temperature of 700° C. to soften their inner surfaces 32 and there the wire warp 84 and the pair of buses 28 were pressed coplanar into the surfaces 32 at a pressure of 200 psi maintained for one minute. The wires 80 and the buses 28 were thereby flattened to a rectangular cross section of about three mils in width and about 0.5 mil in thickness and at the points of the intersections, the buses 28 were diffusion bonded to the wires 80. The plates 34, following convection cooling in a cooldown zone, together with their imbedded wires 80 and pair of buses 28, were joined with the front surfaces 52 of the silicon wafers 50. The combination of plates 34 and wafers 50, with the wires 80 and buses 28 therebetween, were then electrostatically bonded to each other in the second conveyorized furnace press 112 at a temperature of 400° C., a voltage of 1,000 VDC and a pressure of 100 psi, all maintained for about three minutes. The resultant solar cells 10 were then trimmed from each other when exiting from the second furnace 112, and tested. The solar cells 10 were characterized by having a contact resistance of about 30 m$\Omega$-cm$^2$ between the metallic grid 18 and the front semiconductor stratum 12.

Conclusion

Thus it has been shown and described a cost-effective method and apparatus for the front surface metallization and encapsulation of solar cells 10, which method, apparatus and solar cell 10 satisfy the objects and advantages set forth above.

Since certain changes may be made in the present disclosure without departing from the scope of the present invention, it is intended that all matter described in the foregoing specification or shown in the accompanying drawings, be interpreted in an illustrative and not in a limiting sense.

What is claimed is:

1. A method of front surface metallization and encapsulation for solar cells comprising:
   (a) providing a transparent plate having inner and outer surfaces;
   (b) heating said plate so as to soften its said inner surface;
   (c) pressing a mesh of wires fed from spools into said softened plate inner surface;
   (d) providing a semiconductor wafer having front and rear semiconductor strata; and
   (e) bonding said plate inner surface, together with said mesh of wires embedded therein, to said semiconductor wafer.

2. A method of front surface metallization encapsulation for solar cells comprising:
   (a) providing a transparent plate having inner and outer surfaces;
   (b) depositing an anti-reflective coating onto said plate inner surface;
   (c) heating said plate so as to soften its said inner surface;
   (c) stretching a mesh of wires fed from wire feeding means over a mandrel and pressing therewith said mesh of wires into said softened plate inner surface;
   (e) providing a semiconductor wafer having front and rear semiconductor strata; and
   (f) bonding said plate inner surface, together with said mesh of wires embedded therein, to said semiconductor wafer.

3. A continuous method of front surface metallization and encapsulation for solar cells comprising:
   (a) stretching a plurality of wires over an endless belt;
   (b) periodically dispensing at least one metallic strip over and normal to said plurality of wires so as to extend over said wires as said wires are periodically advanced by an indexing motion of said endless belt;
   (c) periodically dispensing a transparent plate onto said plurality of wires and over said one metallic strip;
   (d) heating said transparent plate;
   (e) pressing said plurality of wires and said one metallic strip into a softened surface of said plate;
   (f) periodically dispensing and mating a surface of a semiconductor wafer having a p-n junction with said softened surface of said transparent plate, thereby embedding said plurality of wires and said one metallic strip in said softened surface; and
   (g) electrostatically bonding said plate surface to said semiconductor surface, with said wires and said strip forming electrical contact with said semiconductor surface.

4. The continuous method of claim 3 further including applying pressure to force said plate surface to said semiconductor surface during said electrostatic bonding of said surfaces to each other.

* * * * *